(12) United States Patent
Bewersdorff-Sarlette et al.

(10) Patent No.: US 12,446,390 B2
(45) Date of Patent: Oct. 14, 2025

(54) STABILIZATION OF LASER-STRUCTURED ORGANIC PHOTOVOLTAICS

(71) Applicants: HELIATEK GmbH, Dresden (DE); Fraunhofer-Gesellschaft zur Förderung der angewandten Forschung e.V., Munich (DE)

(72) Inventors: Ulrike Bewersdorff-Sarlette, Dresden (DE); Martin Pfeiffer-Jacob, Dresden (DE); Michiel Top, Dresden (DE); John Fahlteich, Dresden (DE); Nicole Prager, Dresden (DE)

(73) Assignees: HELIATEK GmbH, Dresden (DE); Fraunhofer-Gesellschaft zur Förderung der angewanten Forschung e.V., Munich (DE)

( * ) Notice: Subject to any disclaimer, the term of this patent is extended or adjusted under 35 U.S.C. 154(b) by 52 days.

(21) Appl. No.: 17/413,580

(22) PCT Filed: Dec. 16, 2019

(86) PCT No.: PCT/DE2019/101097
§ 371 (c)(1),
(2) Date: Dec. 21, 2021

(87) PCT Pub. No.: WO2020/119865
PCT Pub. Date: Jun. 18, 2020

(65) Prior Publication Data
US 2022/0310949 A1   Sep. 29, 2022

(30) Foreign Application Priority Data
Dec. 14, 2018   (DE) .................. 10 2018 132 342.5

(51) Int. Cl.
*H01L 31/00* (2006.01)
*H10K 30/81* (2023.01)
(Continued)

(52) U.S. Cl.
CPC ............ *H10K 30/81* (2023.02); *H10K 30/88* (2023.02); *H10K 71/211* (2023.02)

(58) Field of Classification Search
CPC ...... H10K 30/81; H10K 30/88; H10K 71/211; H10K 71/20; Y02P 70/50; Y02E 10/549; C09D 5/00; C09D 183/00
See application file for complete search history.

(56) References Cited

U.S. PATENT DOCUMENTS 6,069,313 A * 5/2000 Kay .................... H01G 9/2031
                                                     429/111
6,652,904 B1 * 11/2003 Phani ................. H01M 14/005
                                                     136/251

(Continued)

FOREIGN PATENT DOCUMENTS

CN    202167502 U   3/2012
CN    103187455 A   7/2013
(Continued)

OTHER PUBLICATIONS

Machine translation of CN 10703339, pp. 1-10. (Year: 2018).*
(Continued)

*Primary Examiner* — Thanh Truc Trinh
(74) *Attorney, Agent, or Firm* — Viering, Jentschura & Partner mbB

(57) ABSTRACT

When organic photovoltaic components are laser-structured, protuberances occur, which can protrude significantly beyond the height of the layered stack. The invention describes a technique for stabilising the laser-structured protuberances so that further processing of the semi-finished product is possible, and describes the integration of said product in a subsequent encapsulation of the OPV component.

13 Claims, 6 Drawing Sheets

(51) Int. Cl.
*H10K 30/88* (2023.01)
*H10K 71/20* (2023.01)

(56) References Cited

U.S. PATENT DOCUMENTS

| | | | |
|---|---|---|---|
| 9,590,133 | B1 | 3/2017 | Welser et al. |
| 2002/0172766 | A1* | 11/2002 | Laxman ............... C07F 7/1896 556/466 |
| 2007/0090371 | A1 | 4/2007 | Drechsel et al. |
| 2008/0102206 | A1 | 5/2008 | Wagner |
| 2008/0102223 | A1 | 5/2008 | Wagner et al. |
| 2010/0108135 | A1* | 5/2010 | Morooka ............ H01G 9/2022 257/E31.127 |
| 2012/0121823 | A1 | 5/2012 | Chhabra et al. |
| 2012/0211048 | A1* | 8/2012 | Murofushi .......... H01M 14/005 136/259 |
| 2013/0104968 | A1 | 5/2013 | Pfeiffer et al. |
| 2013/0241076 | A1 | 9/2013 | Mandlik et al. |
| 2013/0258483 | A1 | 10/2013 | Pett et al. |
| 2015/0027531 | A1 | 1/2015 | Yamashita et al. |
| 2015/0122314 | A1* | 5/2015 | Snaith .................... H10K 85/00 136/255 |
| 2015/0280170 | A1 | 10/2015 | Harikrishna et al. |
| 2016/0155986 | A1 | 6/2016 | Ito et al. |
| 2016/0218308 | A1* | 7/2016 | Desilvestro ............ H10K 85/00 |
| 2018/0138326 | A1 | 5/2018 | Aoki |
| 2021/0288112 | A1 | 9/2021 | Heimke et al. |

FOREIGN PATENT DOCUMENTS

| | | | |
|---|---|---|---|
| CN | 103210479 | A | 7/2013 |
| CN | 103270433 | A | 8/2013 |
| CN | 103311454 | A | 9/2013 |
| CN | 104160062 | A | 11/2014 |
| CN | 104952904 | A | 9/2015 |
| CN | 107603339 | * | 1/2018 |
| DE | 102015116418 | A1 | 3/2016 |
| DE | 102016118177 | A1 | 3/2018 |
| EP | 3198660 | A1 | 8/2017 |
| JP | 2003115598 | A | 4/2003 |
| JP | 2012023070 | A | 2/2012 |
| JP | 2012190612 | A | 10/2012 |
| JP | 2015157370 | A | 9/2015 |
| JP | 2017011066 | A | 1/2017 |
| JP | 2017168798 | A | 9/2017 |
| JP | 2019050196 | A | 3/2019 |
| WO | 2004083958 | A2 | 9/2004 |
| WO | 2011138021 | A2 | 11/2011 |
| WO | 2018219154 | A1 | 12/2018 |

OTHER PUBLICATIONS

Top et al., "Hollow-cathode activated PECVD for the high-rate deposition of permeation barrier films", Surface & Coatings Technology 314 (2017) 155-159. (Year: 2016).*
Search Report for the corresponding German patent application No. 10 2018 132 342.5, issued Jul. 5, 2019, 8 pages (for informational purposes only).
Mandy Gebhardt et al., "Laser Structuring of Flexible Organic Solar Cells : Manufacturing of polymer solar cells in a cost-effective roll-to-roll process", Laser Technik Journal, Jan. 1, 2013, p. 25-28, vol. 10, No. 1, Wiley-VCH Verlag GmbH & KGaA, Weinheim.
International Search Report for the corresponding PCT application No. PCT/DE2019/101097, mailed Jul. 16, 2020, 6 pages (for informational purposes only).
Hessel L. Castricum et al., "Tailoring the Separation Behavior of Hybrid Organosilica Membranes by Adjusting the Structure of the Organic Bridging Group", Advanced Functional Materials, Jun. 21, 2011, p. 2319-2329, vol. 21, No. 12, Wiley-VCH Verlag GmbH & KGaA, Weinheim.
Hiroki Nagasawa et al., "Microporous organosilica membranes for gas separation prepared via PECVD using different O/Si ratio precursors", Journal of Membrane Science 489, Apr. 7, 2015, p. 11-19.
Bahroun K et al., "Influence of layer type and order on barrier properties of multilayer PECVD barrier coatings", Jounal of Physics D: Applied Physics 7, 2014, 8 pages.
First Office Action issued for the corresponding Chinese patent application No. 201980082412.5, dated Jan. 15, 2024, 6 pages (for informational purposes only).
First Search issued for the corresponding Chinese patent application No. 201980082412.5, dated Jan. 15, 2024, 3 pages (for informational purposes only).
Notice of Reasons for refusal issued for the corresponding Japanese patent application No. 2021 534305, dated Nov. 30, 2023, 6 pages (including 3 pages English translation) (for informational purposes only).
Search Report by Registered Search Organization issued for parallel Japanese patent application No. 2023093160, dated Nov. 30, 2023, 17 pages (for informational purposes only).

* cited by examiner

STABILIZATION OF LASER-STRUCTURED ORGANIC PHOTOVOLTAICS

CROSS-REFERENCE TO RELATED APPLICATIONS

This is a national phase application of PCT/DE2019/101097, which was filed on Dec. 16, 2019, and which claims priority to German Application 10 2018 132 342.5, which was filed on Dec. 14, 2018, the entirety of each of which are hereby incorporated herein by reference.

TECHNICAL FIELD

The invention describes a method for producing a layer for stabilizing the upward bulges of a laser-patterned organic photovoltaic (OPV), and a stabilization layer for laser-patterned organic photovoltaics.

BACKGROUND

Organic photovoltaic modules consist of a stack applied to a substrate and comprising two electrodes, with one electrode being applied on the substrate and the other as a counterelectrode remote from the substrate. Located between the two electrodes is an organic layer stack. The organic photovoltaic modules may be manufactured, for example, by evaporation of the materials, by printing of polymers, or by processing from liquids.

DETAILED DESCRIPTION

Figure 1:
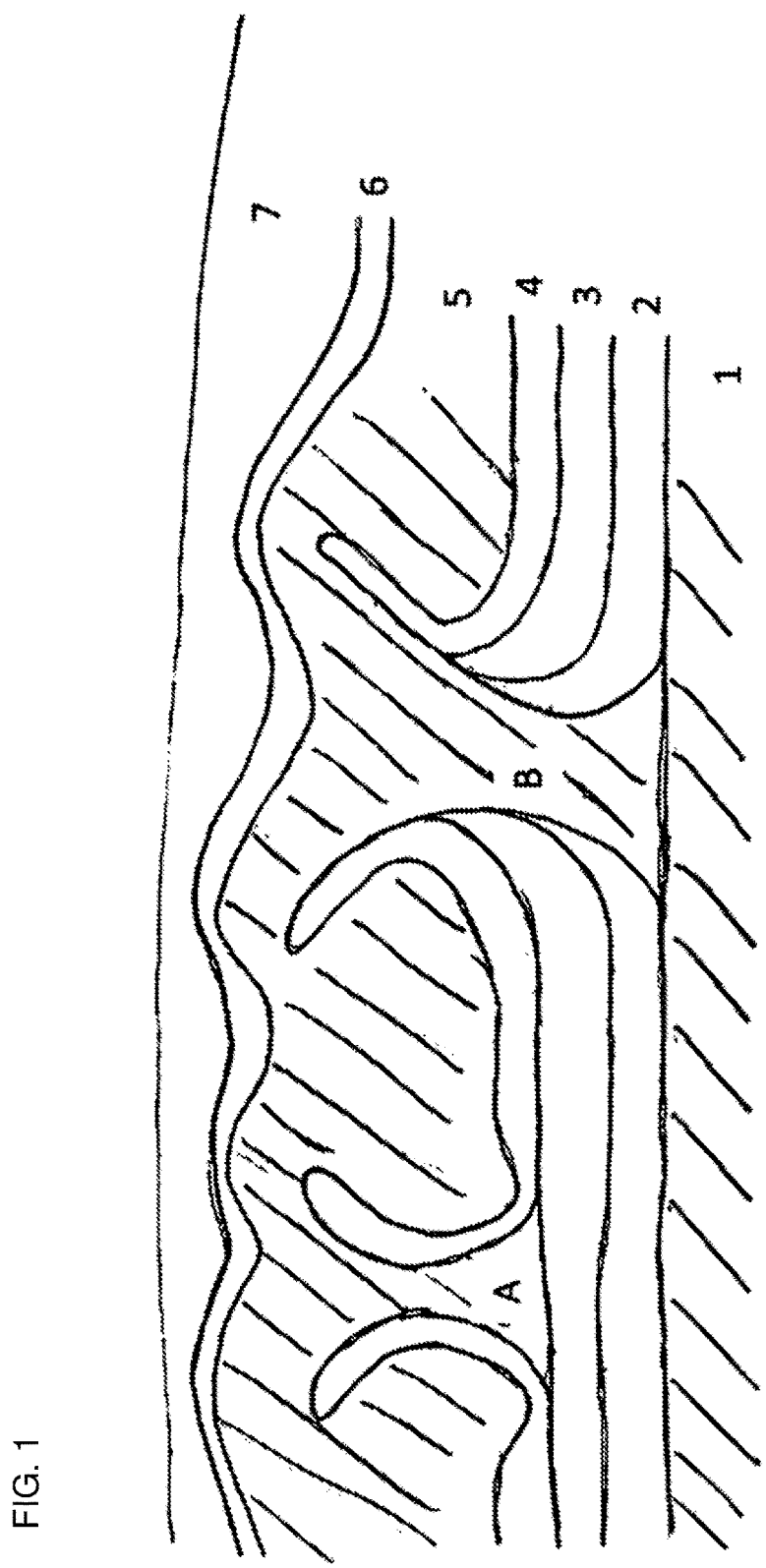
FIG. 1 shows, illustratively, the topography of laser-patterned organic solar cells with the upward bulges (A) (and (B)), for which encapsulation must be stabilized and planarized, including the stabilization layer (5) of the invention, an optional planarization layer (6), and an encapsulation (7).
Figure 2:
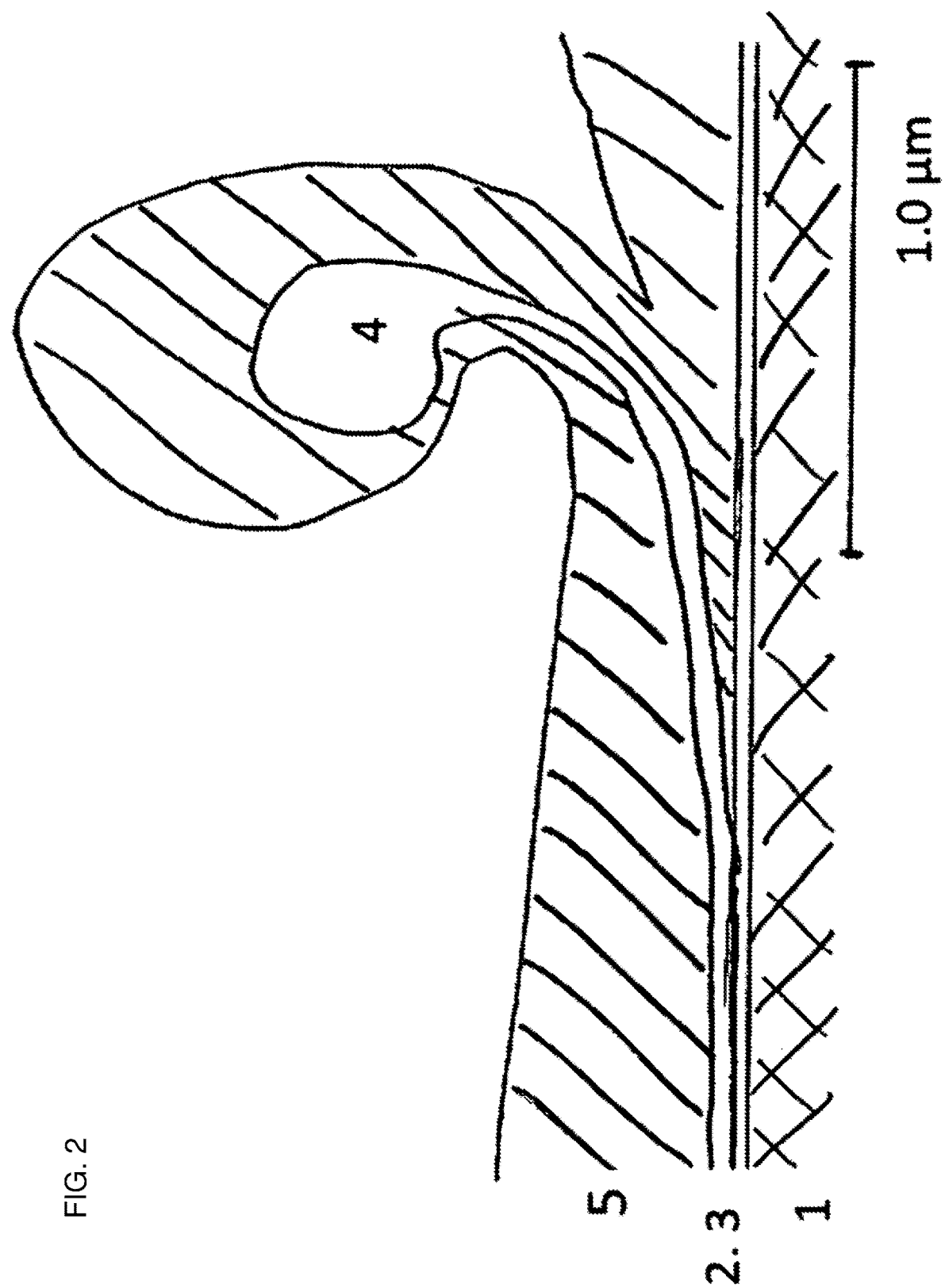
FIG. 2 to FIG. 5 illustrates the size of the laser-patterned bulges in relation to the stabilization layer (5), and the optional planarization layer (6) and the encapsulation (7).
Figure 3:
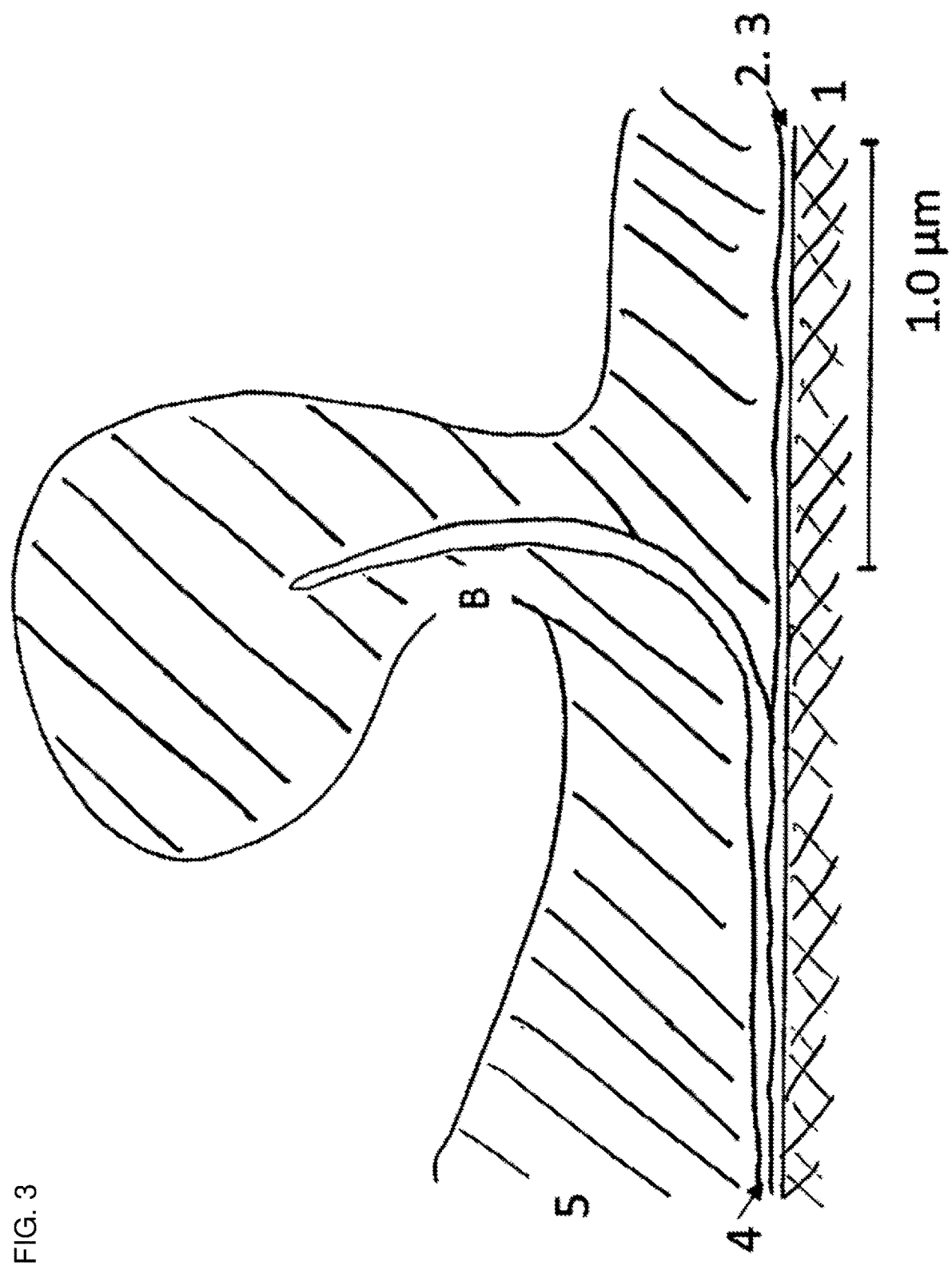
Figure 4:
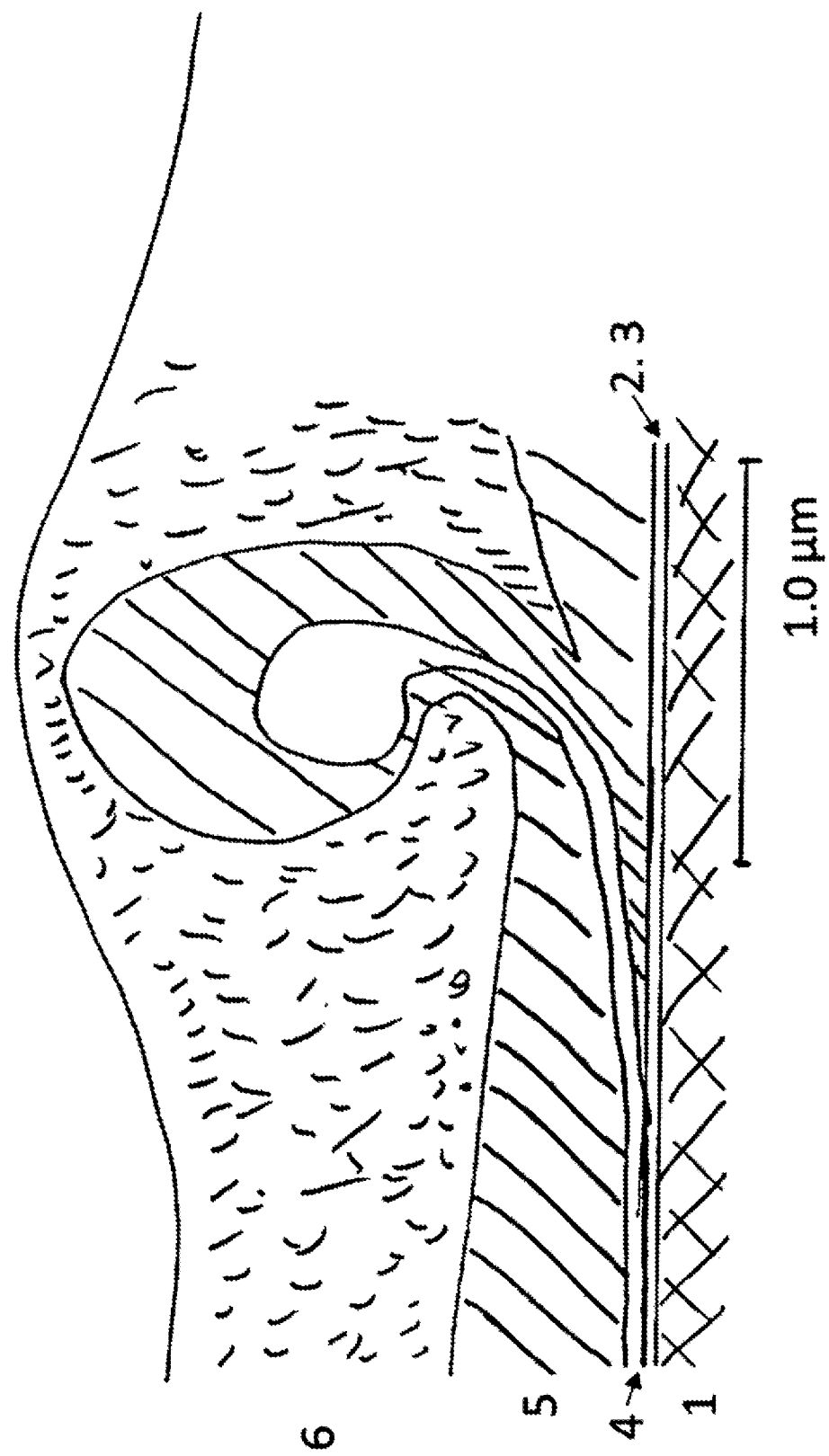
Figure 5:
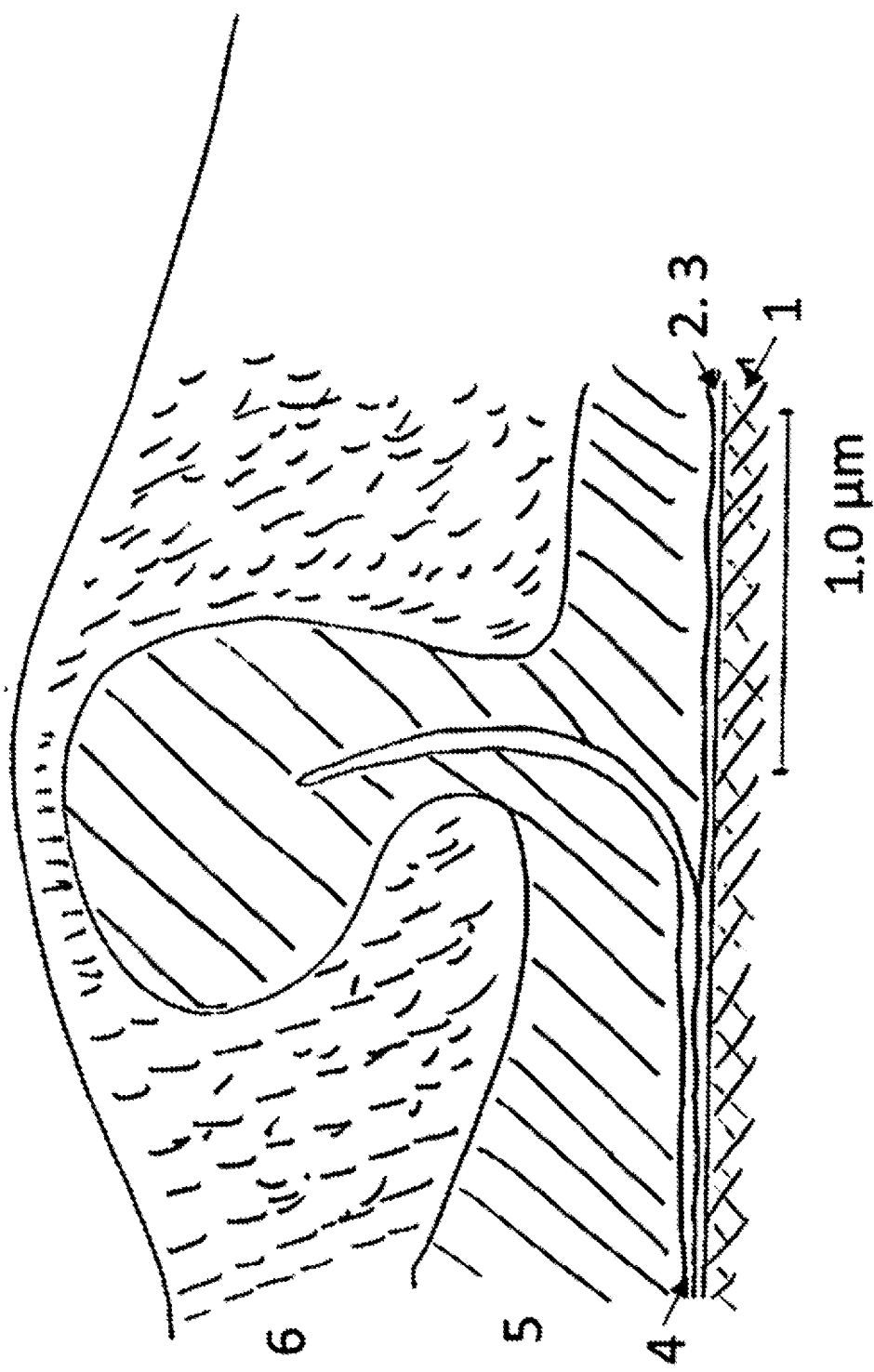

The inventors understand small molecules to be absorber materials which comprise a well-defined number of monomers, typically less than ten, and which have a well-defined mass, typically of less than 1500 g/mol, preferably less than 1200 g/mol, and which are free from undefined, possibly reactive groups on the end of the molecular chain, as may be present as a byproduct of polymerization chain reaction in polymers. Advantages of these absorber molecules based on small molecules are a capacity for evaporation under reduced pressure and hence an associated possibility of cleaning by gradient sublimation. It is therefore possible to manufacture multilayer systems of any desired complexity through sequential evaporation of different and pure materials. These absorber materials additionally enable photoactive heterojunctions (for example bulc-heterojunction). A photoactive layer in a layer stack of a cell may comprise only one acceptor or only one donor absorber material, or else may comprise a combination of two or more absorber materials of the same and/or different types, and contribute to the formation of the exitons. The absorber layers may additionally be admixed with materials for improving the absorption properties.

In addition, the organic layer stack, between the electrodes, may consist not only of photoactive (absorber) layers. Instead the layer stack may also incorporate further layers, examples being transport layers, preferably doped transport layers between . . . individual photoactive (absorber) layers/absorber layer systems and between an organic photoactive (absorber) layer system and the electrodes, in order to construct multicell systems. As a result it is possible to arrange the photoactive layers optimally in respect of the field strength distribution of the optical field.

The lifetime of organic photovoltaic modules (organic solar cells or organic photodetectors) is sharply diminished by direct contact with air and/or oxygen and/or water, and they must therefore be adequately protected by encapsulation. The encapsulation may be implemented with barrier films or by direct encapsulation.

Laser-processed organic photovoltaic modules are patterned by means of laser processes. This process is used/can be used in particular in a roll-to-roll process, in one instance for the connection of individual solar cell strips on a module, and also for the electrical separation of solar modules. The connection of organic photovoltaic strips to form a module may be accomplished by laser interconnection (P1, P2, P3, P4).

Particularly in the context of the patterning of electrodes, this procedure produces upward bulges, referred to as laser scribes, which may exceed by a multiple the height of the layer stack of the flat topology of a stack of an organic photovoltaic module. Upward bulges have already been measured that have a height of more than 2 µm for an organic layer stack thickness of around 100 to 400 nm. These bulges, without a capping layer may cause damage to the module when a module is wound, or the organic layers are damaged by the adhesives used in a subsequent encapsulation.

It is known to print a UV-crosslinked layer as a winding protection layer, with the layer being silicone-based and applied in liquid form, in order to prevent shortcircuiting as a result of the bulges turning down or collapsing within further process steps, such as during winding of the module, for example.

Disadvantages in the Prior Art

Printed UV-crosslinked layers may still exhibit outgassing after crosslinking, thereby possibly impairing the adhesion of the subsequent encapsulation. Sporadically, moreover, detachment of the counterelectrode has been observed. Moreover, the application of liquid materials to the underlying organic stack is not favorable, since these materials may attack the organic system, i.e., the organic layer stack disposed between the electrodes, leading to a reduction in the lifetime of the organic solar cell and in the performance. In the roll-to-roll process for producing extensive modules, simple lining of the organic system, as is used in the case of small laboratory samples, is not enough, since shortcircuits may arise as a result. In the roll-to-roll process, moreover, it is necessary to keep the operating parameters constant within certain tolerances, to enable uniform application of the material.

Some methods include alteration of the plasma mixture within the chamber, during this process step in the chamber (severe variation in the parameters), with the consequence of the application of a plurality of different layers of the coating. These methods are unsuitable for use in the production of extensive modules in a roll-to-roll process. The method can be used only in a "stationary" chamber, and not if the article to be coated is moved through the chamber.

The technical problem on which the present invention is based was that of stabilizing, on the one hand, upward bulges produced by laser patterning of the individual layers of the solar cell, in order to enable sealing or sealed enclosure by means of a thin layer, that eliminates the disadvantages found in the prior art and on the other hand can be integrated in a roll-to-roll process. The possibility for deployment in particular in the case of OPV based on small molecules is important. After the application of this layer, an encapsulation can then be applied to a smooth surface. It is also important that the layer itself enables winding of the semifinished product and, moreover, has no harmful consequences for subsequent winding and unwinding of the end product.

The inventors understand a semifinished product to be an OPV module which is not yet encapsulated. The end product is encapsulated and equipped with the necessary connections for operation. The purpose of encapsulation is to provide a barrier toward environmental influences, such as water/water vapor, so as to increase the lifetime of the OPV module.

The technical problem for stabilization of the upward bulges produced by laser processing is solved by means of a stabilization layer based on a nanoporous plasma polymer, such as SiOCH, for example.

Nanoporous materials consist of a regular framework, which possesses a regular porous structure. The size of the pores is in the nanometer range. They are divided according to IUPAC into three groups: microporous materials, with a size<2 nm; mesoporous materials, with a size of 2 to 50 nm; and macroporous materials with a size of more than 50 nm.

The encapsulation can then be applied to this stabilization layer; encapsulation may necessitate prior planarization.

The application of the SiOCH layer may be deposited by means of plasma enhanced chemical vapor deposition (PECVD) processes, such as, for example, hollow cathode enhanced PECVD (arcPECVD) processes, by way of HMDSO precursor or bis-trimethylsilylmethane (BTMSM) precursor or tetraethyl orthosilicate (TEOS) precursor or tetramethylsilane (TMS) precursor or hexamethyldisilazane (HMDSN) precursor (other precursors (precursor materials) are conceivable). The use of the microwave PECVD process is known from the field of production for the encapsulation of OLEDs (organic light emitting diodes). In the production of OLEDs, laser patterning of the layers is not necessary and known, and so with OLEDs a flat topology is obtained, and the encapsulation can be realized directly, for example, by thin film encapsulation (TFE), which is accomplished by microwave PECVD deposition. In the production of OLEDs, a plasma polymer is proposed as one of the barrier materials, this polymer possessing a low dielectric constant k (low-k material).

The method of the invention differs from the microwave PECVD process used in the OLED sector, which is primarily oxidic in nature and which influences the organic fraction of a layer, in the use of a direct-current source. As a result it is possible in accordance with the invention to deposit even thicker layers, up to 500° nm or up to around 1 or 2 µm, than in the case of a direct SiN encapsulation, which is typically around 100° nm thick.

For the use of the layer for stabilizing the laser-patterned upward bulges, it is particularly important that this layer has nanoporous properties, allowing the stabilization layer also to be wound in the further production process. The production: parameters known in the prior art do not lead to a nanoporous, flexible layer, but instead more to a very stable, inflexible layer. Only through extensive studies and adaptations of the parameters was it possible to produce a nanoporous, flexible layer which eliminates the disadvantages in the prior art.

SiOCH is a silicon oxide (Siox) which by means of a carbon fraction acquires organic properties; in other words, as a result of the carbon fraction, the chemical microstructure is influenced, as is the polymerlike, partially crosslinked chain structure. The material is more elastic and more flexible than Siox, being a nanoporous material which has flexible and elastic properties.

The technical problem for the stabilization and encapsulation of the laser-patterned upward bulges (A, B) is solved by the application of a plasma polymer layer and of a subsequent encapsulation, which comprises the following steps:
1. providing a laser-patterned OPV on a substrate, including a patterning at least of the organic stack and of the substrate electrode,
2. applying a stabilization layer,
3. applying an optional planarization layer,
4. applying an encapsulation.

The providing of the laser-patterned OPV includes at least the following steps:
1. providing a substrate (1),
2. applying the substrate electrode (2) and patterning the substrate electrode (2),
3. applying the layers of the organic solar cell, comprising transport layers and photoactive absorber layers, called the stack (3), including patterning the organic layer stack, and
4. the applying of the counterelectrode (4).

Ideally the stabilization layer comprises an SiOCH material, or an SiOCH-like material, which possesses nanoporous properties.

As a result, a stabilization of the laser-patterned upward bulges in preparation for a later encapsulation and as a winding protection layer is provided during the production process.

The use of a different plasma polymer is possible if it does not to any influencing (damage, drop in lifetime) of the organic system of the photovoltaic module, is a transparent material with long-term stability, and exhibits sufficient mechanical stability, i.e., adhesion and flexibility and/or thermal expansion, so that there is no additional stress as a result of differences in expansion of the various materials (organic system and stabilization layer).

Ideally, in a subsequent encapsulation of the complete module with barrier films and adhesives, the stabilization layer protects the organic stack of the solar cell against unwanted interaction with the adhesive of the barrier film.

Ideally the stabilization layer enables winding and unwinding during the subsequent operating steps for the production of the end product in a roll-to-roll operation and/or during the rolling-up of the end product.

As a result of the solution to the technical problem, a stabilization of the laser-processed upward bulges in the organic stack has been provided, allowing the module to be subsequently encapsulated. As a result
a) shortcircuits due to turning down or collapse of the upward bulges after laser patterning are prevented;
b) a closed planar topology is provided, to allow the subsequent encapsulation to be applied to the planar topology needed for the encapsulation process—a thin film encapsulation, for example;

c) winding and unwinding during the roll-to-roll process is made possible, for example, after the application of the stabilization layer and optional planarization layer, by ensuring sufficient mechanical protection of the organic solar cell; and d) on subsequent encapsulation of the complete module with barrier films and adhesives, the stabilization layer of the invention still leads to better protection of the organic stack of the solar cell against unwanted interaction with the adhesive of the barrier film.

The use of the hollow cathode deposition PECVD process and of the SiOCH layer(s) deposited by said process results in the achievement of a better, more elastic structure than when using silicon nitride barrier layers (SiN), even at higher layer thicknesses which are necessary to mask the laser-pattern bulges. Furthermore, this also achieves a water vapor barrier which enables better protection from water vapor during the subsequent process steps, and prevents/reduces outgassing by materials used in the encapsulation into the organic stack.

Organic solar modules are produced in a roll-to-roll process by the provision of a substrate to which the first electrode (substrate electrode) is applied with subsequent patterning, the organic layer stack applied between the first and the second electrode (counterelectrode), comprising not only absorber layers but also (partially) doped and undoped transport layers, and to which, subsequently, the second electrode (counterelectrode) is applied.

In accordance with the invention, a stabilization layer based on a nanoporous plasma polymer is applied to the above-described layer stack in order to protect the laser-patterned bulges.

The stabilization takes place in preparation for a subsequent encapsulation by a method which comprises the following operations:

a) providing the organic stack of the solar cell with P3 patterning:

b) applying the stabilization layer (5) and subsequently applying the encapsulation (7).

The stabilization layer (5) comprises a nanoporous plasma polymer comprising at least one precursor selected from the group of tetramethylsilane (TMS), hexamethyldisiloxane (HMDSO), tetraethyl orthosilicate (TEOS), hexamethyldisilazane (HMDSN), silane ($SiH_4$), triethoxysilanes (TriEOS), tetramethoxysilanes (TMOS), and trimethoxysilanes (TriMOS).

The stabilization layer (5) according to one embodiment has a the thickness of greater than 100 nm, preferably greater than 150 nm, particularly preferably greater than 200 nm, very particularly preferably greater than 300 nm, more than particularly preferably greater than 500 nm The stabilization layer (5) according to one embodiment of the invention comprises at least 2 at % of silicon or titanium, and at least 2 at % of oxygen or nitrogen, and at least 2 at % of carbon.

The stabilization layer (5) according to one embodiment of the invention comprises a carbon fraction of greater than 15 at %, preferably greater than 20 at %, more preferably greater than 25 at %.

According to one embodiment, the stabilization layer (5) may be configured as a gradient, with the carbon content varying over the thickness of the layer by at least 2 at %, preferably by at least 4 at %, more preferably by greater than 6 at %.

During the production of the nanoporous plasma polymer, a reaction gas is used which is selected from nitrogen and/or oxygen.

In a further embodiment, the stabilization layer comprises an SiOCH-like material, as for example SiONCH, SiNCH.

These are produced by using precursors selected from the above-stated group, in conjunction with nitrogen as reaction gas.

Additionally/alternatively a titanium-containing layer may be used as a stabilization layer. Such a layer may be produced using titanium-containing monomers, e.g., titanium propoxide or tetraisopropoyl orthotitanate (TIPT) or $TiCl_4$.

In a further embodiment, tetramethylaluminum or trimethylaluminum is proposed as a stabilization layer, and may be produced by the use of $Al_2O_3$ in conjunction with $N_2O$.

In addition, during production, an inert gas is used which is selected from the group of the noble gases, as for example argon, xenon, neon; preferably, argon is used.

The inventors have adapted the parameters for producing the stabilization layer in extensive investigations. In the adverse case, when using the parameters identified in the prior art, the stabilization layer obtained is so firm that it leads to the detachment of the electrode from the organic stack during winding.

In accordance with the invention, the ratio of the reaction gas to the precursor is greater than 4, preferably greater than 6, and is less than 20, preferably less than 12, more preferably less than 10. In the case of ratios which are too low, the layer tension of the stabilization layer becomes too great.

In accordance with the invention the coating pressure is less than 50 Pa, preferably less than 10 Pa, more preferably less than 5 Pa.

In accordance with the invention, the plasma power per sccm of precursor monomer is not greater than 100 W/sccm, the plasma power being situated preferably in a range between 15 and 80 W/sccm, in a range between 30 and 80 W/sccm, more preferably in a range between 40 and 50 W/sccm.

The subsequent encapsulation (7) may be implemented by means of barrier films or by direct encapsulation. This may be realized by known processes.

In the case of very large upward bulges, it is necessary in certain circumstances to apply a planarization layer after the stabilization, to allow encapsulation to then take place on a planar surface.

The planarization layer (6) may take place, for example, by applying a printed, UV-crosslinked layer as proposed in DE 10 2015 116 418 A1, or by another material, thereby enabling the provision of the planar surface.

In the case of encapsulation with direct encapsulation, it may be useful to use different precursors. This allows the size of the pores to be varied.

The module may also be encapsulated, in addition, with at least one PECVD layer or ALD (atomic layer deposition) layer.

The production of the possible exemplary embodiments entails the production of the organic solar cell comprising organic layers containing materials based on small molecules in a roll-to-roll coating unit.

Exemplary Embodiment 1

The solar module features a deposition of SiOCH, including wind-ins and wind-outs, and encompasses the following method steps:

1. Production of the organic solar cell in a roll-to-roll coating unit up to and including cathode deposition, with subsequent winding of the solar film
2. Transfer under nitrogen atmosphere to another roll-to-roll PECVD unit, which can be operated at lower pressure
3. Out-winding of the solar film and P3 laser patterning
4. Deposition of a planarization layer as winding protection layer
5. Encapsulation with barrier films Exemplary Embodiment 2

Figure 6:
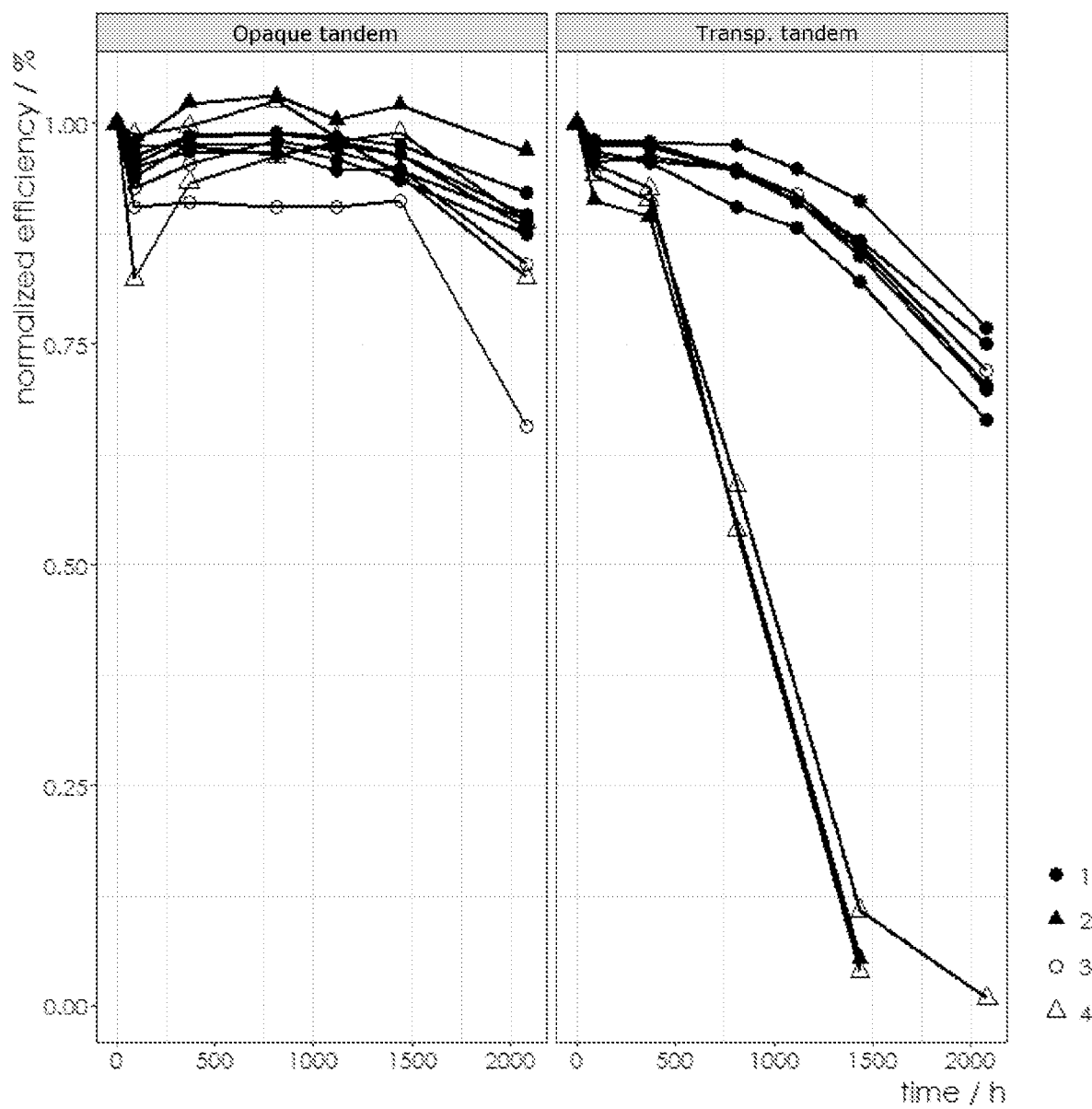
FIG. 6 shows experimental physical results of laser-patterned OPV with and without stabilization layers.

The solar module features a deposition of SiOCH, without wind-ins and wind-outs, and encompasses the following method steps:
1. Production of the organic solar cell in a roll-to-roll coating unit up to and including cathode deposition and P3 laser patterning
2. Subsequently, deposition of a planarization layer in an integrated PECVD unit/chamber (NB: pressure regulation required!)
3. Encapsulation subsequently with barrier films:

FIG. 6 shows the normalized efficiency of a lifetime study of organic tandem solar cells (opaque and transparent solar cells, respectively) with an SiOCH stabilization layer, in comparison to the present arrangement without an SiOCH stabilization layer, the encapsulation used comprising a barrier layer (barrier film) with different adhesives (epoxy vs. acrylic). The systems represented by each of the individual lines are as follows: (indicator represented as a solid circle) with stabilization layer and subsequent encapsulation with barrier film using epoxy adhesive (solid circle); (indicator represented as a solid triangle) without stabilization layer and subsequent encapsulation with barrier film using epoxy adhesive (solid triangle); (indicator represented as an empty circle) with stabilization layer and subsequent encapsulation with barrier film using acrylic adhesive (empty circle); and (indicator represented as an empty triangle) without stabilization layer and subsequent encapsulation with barrier film using acrylic adhesive (empty triangle).

The lifetime is in both cases (with and without stabilization layer, respectively) the same, and slightly improved with epoxy adhesive.

Exemplary Embodiment 3

The solar module withdraws through a deposition of SiOCH in a whole-process thin film encapsulation, including wind-ins and wind-offs, and encompasses the following method steps:
1. Production of the organic solar cell in a roll-to-roll coating unit up to and including cathode deposition, with subsequent winding of the solar film
2. Transfer under nitrogen into different PECVD unit, which can be operated at lower pressure
3. Out-winding of the solar film and P3 laser patterning
4. Deposition of the planarization layer and of the barrier layer or of a corresponding barrier layer stack Exemplary Embodiment 4

The solar module withdraws through a deposition of SiOCH in a whole-process thin film encapsulation, including wind-ins and wind-offs, and encompasses the following method steps:

1. Production of the organic solar cell in a roll-to-roll coating unit up to and including cathode deposition, and P3 laser patterning:
2. Subsequently, deposition of a planarization layer in an integrated PECVD unit/chamber (in this case, pressure regulation is needed!), and of the barrier encapsulation layer or of a corresponding barrier layer stack

LIST OF REFERENCE SYMBOLS

1 Substrate
2 First electrode/substrate electrode:
3 Organic system
4 Second electrode/counterelectrode
5 Stabilization layer
6 Planarization layer
7 Encapsulation
P1, P2, P1, P2, P3, P4 Laser patterning
P3, P4
A, B Upward bulges resulting from the laser patterning of the counterelectrode and the patterning of the OPV

The invention claimed is:

1. A method for stabilizing and encapsulating a laser-patterned organic photovoltaic (OPV) in a roll-to-roll process, comprising the following steps:
   a. providing laser-patterned OPV, by applying a substrate electrode on a substrate, patterning the substrate electrode, applying an organic stack to the substrate electrode, patterning the organic stack, and applying a counterelectrode, wherein at least the organic stack and the substrate electrode on the substrate are laser-patterned;
   b. forming from one or more precursors and a reaction gas a stabilization layer over the counterelectrode using a plasma enhanced chemical vapor deposition (PECVD) process, wherein the reaction gas comprises nitrogen and/or oxygen, wherein a ratio of a flow rate of the reaction gas to the one or more precursors is greater than 2 and less than 20, where a plasma power per sccm of the one or more precursors is greater than 15 and less than 80 W/sccm, wherein the stabilization layer is nanoporous and flexible and comprises:
      silicon;
      oxygen or nitrogen; and
      carbon, wherein the stabilization layer has a pore size that is greater than zero and less than 50 nm; and
   c. applying an encapsulation.

2. The method as claimed in claim 1, characterized in that the counterelectrode is patterned in step a).

3. The method as claimed in claim 1, the steps further comprising, before applying the encapsulation, applying a planarization layer.

4. The method as claimed in claim 3, characterized in that the counterelectrode is patterned after the step of applying the stabilization layer and before the step of applying the planarization layer, wherein after the patterning of the counterelectrode a further stabilization layer is applied.

5. The method as claimed in claim 3, characterized in that the counterelectrode is patterned directly after the step of applying the planarization layer and a further stabilization layer is applied before the step of applying the encapsulation.

6. The method as claimed in claim 1, characterized in that the stabilization layer is applied in a hollow cathode process or in a magnetron PECVD.

7. The method as claimed in claim 1, characterized in that
   a. the one or more precursors is selected from the group of tetramethylsilane (TMS), hexamethyldisiloxane (HMDSO), tetraethyl orthosilicate (TEOS), hexamethyldisilazane (HMDSN), silane ($SiH_4$), triethoxysilanes (TriEOS), tetramethoxysilanes (TMOS), and trimethoxysilanes (TriMOS), and
   b. using an inert gas that comprises one or more noble gases.

8. The method as claimed in claim 1, characterized in that a coating pressure of the PECVD process is less than 50 Pa.

9. The method as claimed in claim 1, wherein the ratio is greater than 4 and less than 10.

10. The method as claimed in claim 1, the stabilization layer is formed through the use of an inert gas, characterized in that a ratio of the inert gas to the one or more precursors is greater than 2 and less than 10.

11. The method as claimed in claim 1, wherein the plasma power per sccm of the one or more precursors is between 30 and 80 W/sccm.

12. The method as claimed in claim 3, characterized in that the planarization layer is formed by:
   printing of a UV-crosslinked layer; or
   using at least one additional precursor in an additional PECVD process to form the planarization layer, wherein the at least one additional precursor for the planarization layer is selected from the group of tetramethylsilane (TMS), hexamethyldisiloxane (HMDSO), tetraethyl orthosilicate (TEOS), hexamethyldisilazane (HMDSN), silane ($SiH_4$), triethoxysilanes (TriEOS), tetramethoxysilanes (TMOS), and trimethoxysilanes (TriMOS).

13. The method as claimed in claim 1, wherein the PECVD process comprises a hollow cathode PECVD process.

\* \* \* \* \*